United States Patent [19]
Ottone et al.

[11] Patent Number: 5,407,416
[45] Date of Patent: Apr. 18, 1995

[54] AUTOMATIC TOOL CHANGE DEVICE FOR PRINTED CIRCUIT BOARD MACHINES

[75] Inventors: Renato Ottone, Ivrea; Luigi Piovano, Giusto Canavese; Guido Gaida, Ponderano, all of Italy

[73] Assignee: Pluritec Italia S.p.A., Borgomanero, Italy

[21] Appl. No.: 972,970

[22] Filed: Nov. 6, 1992

[30] Foreign Application Priority Data

Nov. 8, 1991 [IT] Italy .................. TO91A0856

[51] Int. Cl.[6] ............................ B23Q 3/157
[52] U.S. Cl. ........................ 483/12; 483/52; 483/66
[58] Field of Search .............. 483/36, 37, 51, 52, 483/53, 64, 12, 13, 66; 29/26.4

[56] References Cited

U.S. PATENT DOCUMENTS

| | | | |
|---|---|---|---|
| 3,779,391 | 12/1973 | Sato et al. | 211/1.5 |
| 4,156,962 | 6/1979 | Haller | 29/26 A |
| 4,520,551 | 6/1985 | Imhot | 29/26 A |
| 4,590,662 | 5/1986 | Noroya | 483/64 |
| 4,596,067 | 6/1986 | Raiyeri | 408/3 X |
| 4,658,494 | 4/1987 | Ohtani et al. | 483/51 X |
| 4,715,108 | 12/1987 | Sugiyama et al. | 29/264 X |
| 4,761,876 | 8/1988 | Kosmowski | 408/3 X |
| 5,068,958 | 12/1991 | Kosmowski | 29/568 |

FOREIGN PATENT DOCUMENTS

| | | |
|---|---|---|
| 224714 | 6/1987 | European Pat. Off. . |
| 477766 | 4/1992 | European Pat. Off. . |
| 538642 | 4/1993 | European Pat. Off. . |
| 236041 | 5/1986 | German Dem. Rep. . |
| 1552326 | 1/1970 | Germany . |
| 0221673 | 5/1985 | Germany .............. 483/37 |
| 8816298 | 8/1989 | Germany . |
| 3166031 | 7/1991 | Japan . |
| 1135592 | 9/1985 | U.S.S.R. . |

OTHER PUBLICATIONS

Derwent Abstract SU 1,135,592 Sep. 1985.
Patent Abstracts of Japan JP 3,166,031 Jul., 1991.

*Primary Examiner*—Z. R. Bilinksy
*Attorney, Agent, or Firm*—Ladas & Parry

[57] ABSTRACT

The tool store comprises a prismatic drum having a number of cells in which the tools may be inserted singly or housed inside a magazine; and the tool change device comprises a pair of clamps operated singly and fitted to the work table. The clamps are moved simultaneously in a direction perpendicular to the axis of the drum, for withdrawing or loading the tool from/on to the drum or spindle; the tool being transferred between the drum and spindle by the work table; and a sensor being provided for detecting the tip of the tool inserted in the spindle and so adjusting the axial position of the tool in the spindle.

20 Claims, 8 Drawing Sheets

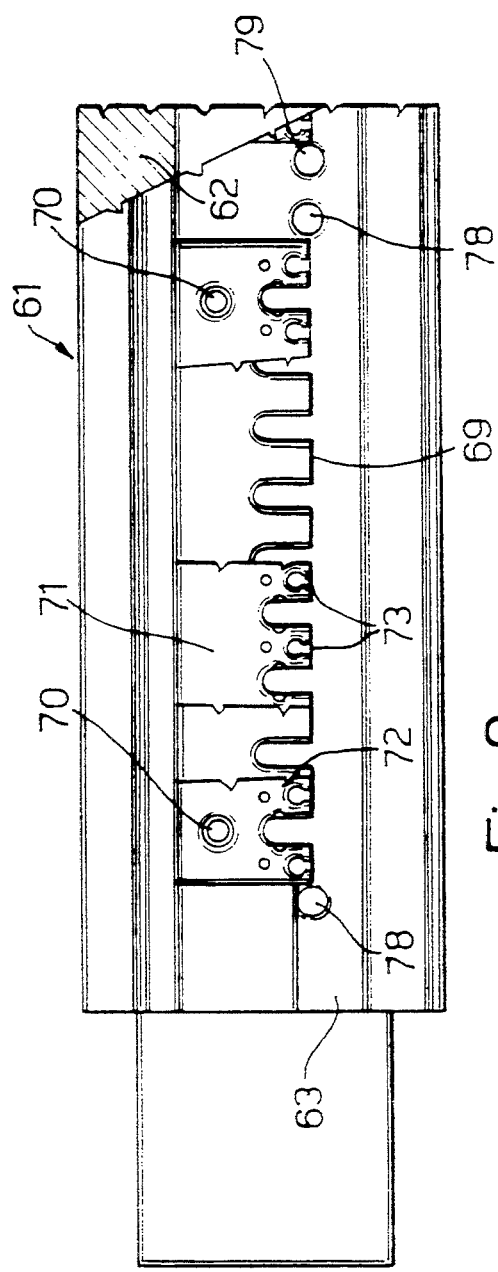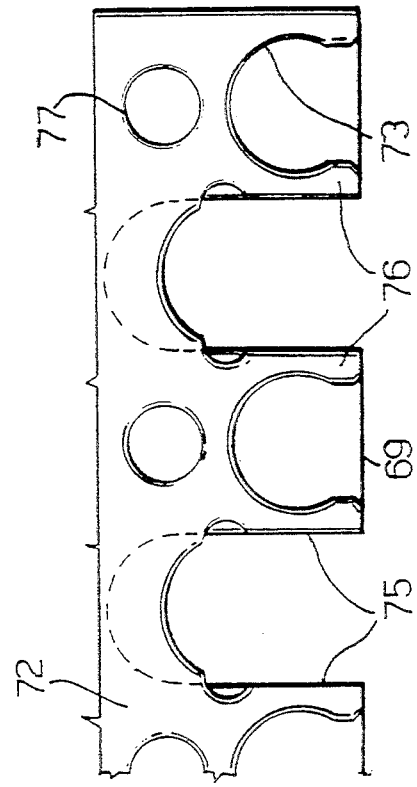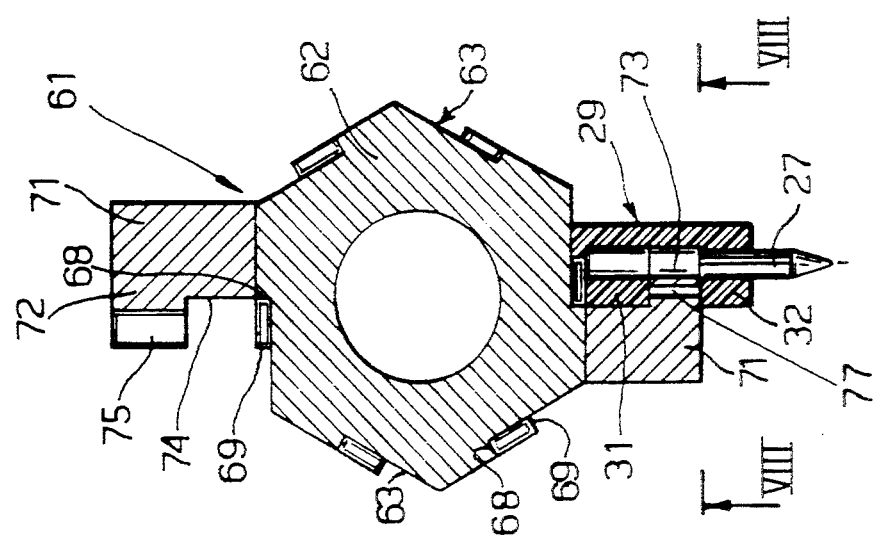

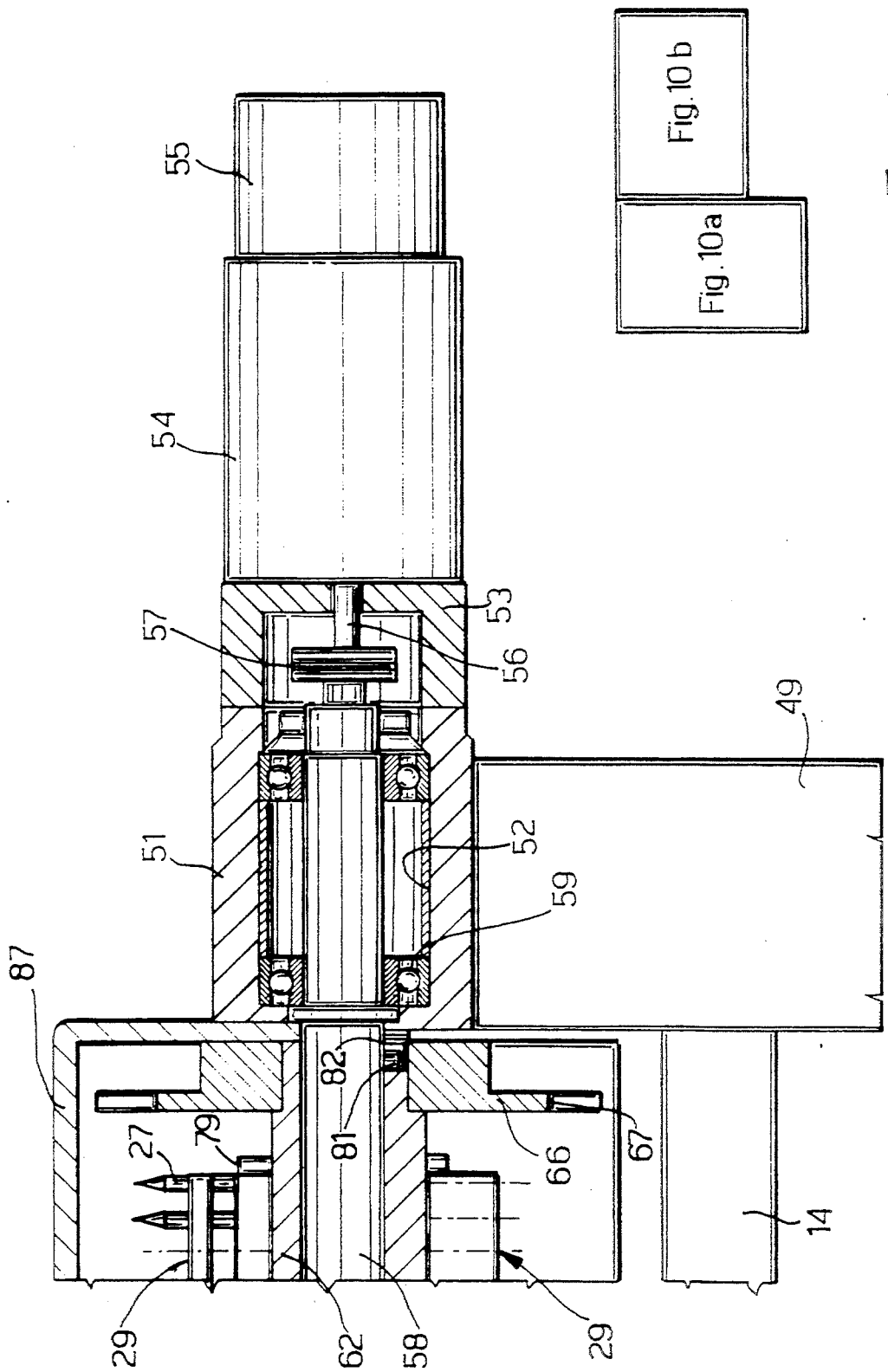

AUTOMATIC TOOL CHANGE DEVICE FOR PRINTED CIRCUIT BOARD MACHINES

BACKGROUND OF THE INVENTION

The present invention relates to an automatic tool change device for printed circuit board machines.

Numerous devices are known for automatically changing the tool on the tool spindle, for example, of printed circuit board drilling machines, which devices must be designed for catering to extremely small tools. On one known machine, the tool store consists of a support on the work table with a number of tool seats arranged in rows and columns. Each tool presents a collar for positioning it axially inside the seat, and is selected directly via relative displacement of the work table and the machining head, and is inserted and withdrawn via axial displacement of the tool spindle.

A major drawback of the above machine is that the tools must be inserted manually inside the collars and subsequently inserted inside the seats in the store. As the latter operation can only be performed with the machine at a standstill, this obviously results in considerable downtime, while both the above operations may possibly result in serious damage to the tip of the tool.

On another known machine, the tool store is again fitted to the work table, which travels along two perpendicular axes, and the store is designed to receive a number of tool magazines, each containing a row of tools with a collar or similar for positioning the tool axially in relation to both the magazine and the spindle.

On the above machine also, the spindle requires means for axially arresting the tool, and loading of the magazines inside the store must be performed with the machine at a standstill, involves a certain amount of time and care on the part of the operator, and, as in the previous case, may possibly result in damage to the tools.

SUMMARY OF THE INVENTION

It is an object of the present invention to provide a straightforward automatic tool change device for printed circuit board machines, designed to eliminate the aforementioned drawbacks typically associated with known devices.

According to the present invention, there is provided a tool change device comprising a store having a number of rows of cells housing the tools; tool clamping means; and means for transferring the tool between said store and a tool spindle; characterized by the fact that means are provided for removably assembling said store; said cells being designed to house said tools both singly and arranged inside a magazine; and means being provided for moving said store in a plane perpendicular to said rows, for selecting the row of tools to be presented to said clamping means.

It is a further object of the present invention to provide for accurate axial positioning of the tool on the spindle, with no need for stop means on the tool.

According to the present invention, there is provided a device comprising a sensor for detecting said tool inside said spindle; and drive means for axially moving said spindle and so enabling said sensor to detect the tip of said tool; characterized by the fact that said sensor cooperates with said clamping means; said drive means being controlled; and said clamping means and said spindle providing alternately for clamping said tool in response to a signal from said sensor, for accurately adjusting the axial position of said tool in said spindle.

BRIEF DESCRIPTION OF THE DRAWINGS

A preferred non-limiting embodiment of the present invention will be described by way of example with reference to the accompanying drawings, in which:

FIG. 7 shows an enlarged partial section along line VII—VII in FIG. 6;

FIG. 8 shows a partial view of the store along line VIII—VIII in FIG. 7;

FIG. 9 shows an enlarged view of a detail in FIG. 8;

FIGS. 10a and 10b show two enlarged portions of a section along line X—X in FIG. 2;

FIG. 11 shows a section along line XI—XI in FIG. 10a;

FIG. 12 shows a section along line XII—XII in FIG. 10a;

DETAILED DESCRIPTION OF THE INVENTION

FOREWORD

Figure 1:
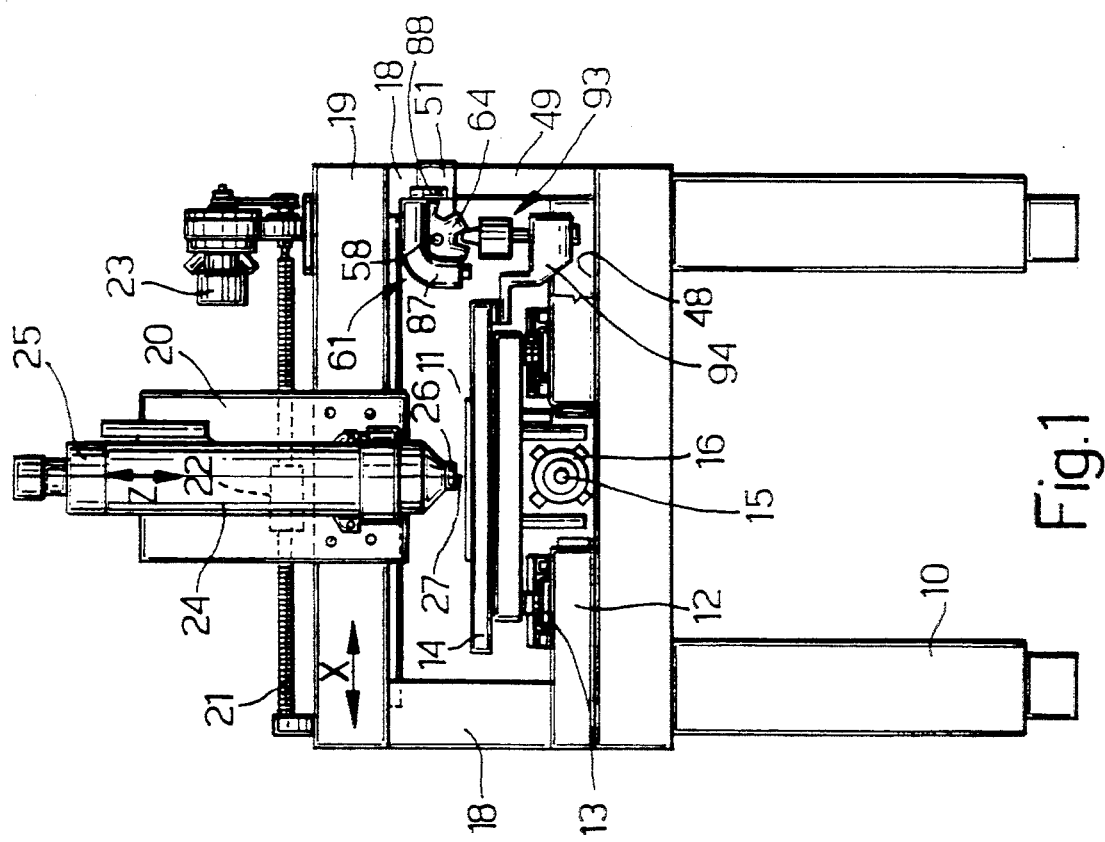
FIG. 1 shows a schematic front view of a printed circuit board drilling machine incorporating an automatic tool change device in accordance with the present invention.

Number 10 in FIG. 1 indicates the bed of a machine tool, e.g. a drilling machine, for machining packs 11 of printed circuit boards. Bed 10 is fitted with a fixed longitudinal guide plate 12 of granite over which a work table 14 slides on air pads 13. A screw 15 on plate 12 engages a nut screw 16 integral with table 14, and is rotated by a servomotor 17 (FIG. 2) for moving table 14 along axis Y.

Bed 10 also presents two uprights 18 fitted with a fixed crosspiece 19 also made of granite and along which a machining head 20 travels on further air pads along axis X, driven by a further servomotor 23 via a further screw-nut screw pair 21-22.

Machining head 20 comprises a sleeve 24 moved vertically along axis Z by a third servomotor 25 (FIG. 1) and having a tool spindle 26, e.g. for a drilling tool 27, and a tool clamp operated automatically in known manner. Servomotors 17, 23 and 25 are controlled in known manner by an electronic numerical control unit.

Tools 27 on the above machine present a cylindrical shank 28 (FIGS. 3 and 4), and are normally supplied by the maker in a plastic cartridge or magazine 29 containing, for example, ten tools 27. Magazine 29 consists of a top and bottom longitudinal bar 32, 31 having rounded sides 35 (FIG. 5) and formed in one piece with a flat wall 33. Bars 31 and 32 are separated by an opening 34, and present respective series of holes 36 and 37 of substantially the same diameter as shank 28 of tool 27. Holes 36 are coaxial with holes 37 and partially closed at the bottom by a step 38 on wall 33 for axially arresting tool 27.

Bottom bar 31 of magazine 29 also presents two supporting appendixes 39 and at least two square-section holes 40 closed at the top and engaged by respective pins 41 formed in one piece with wall 42 of a box 43 in which magazine 29 is packed. Box 43 also comprises two half shells 44 which fit together in the closed position and are connected to wall 42 by a flexible thin portion enabling half shells 44 to be opened and closed.

Each half shell 44 also presents a comb 45 engaging a conical portion 46 close to the tip of tool 27, for ensuring tool 27 rests firmly on step 38 on wall 33. Alternatively, only one of half shells 44 may present a comb engaging, with a small amount of friction, cylindrical shank 28 of tool 27 at opening 34 between bars 31 and 32. In either case, half shells 44 present longitudinal ribs 47 for positioning magazine 29 inside box 43.

TOOL STORE

Figure 10:
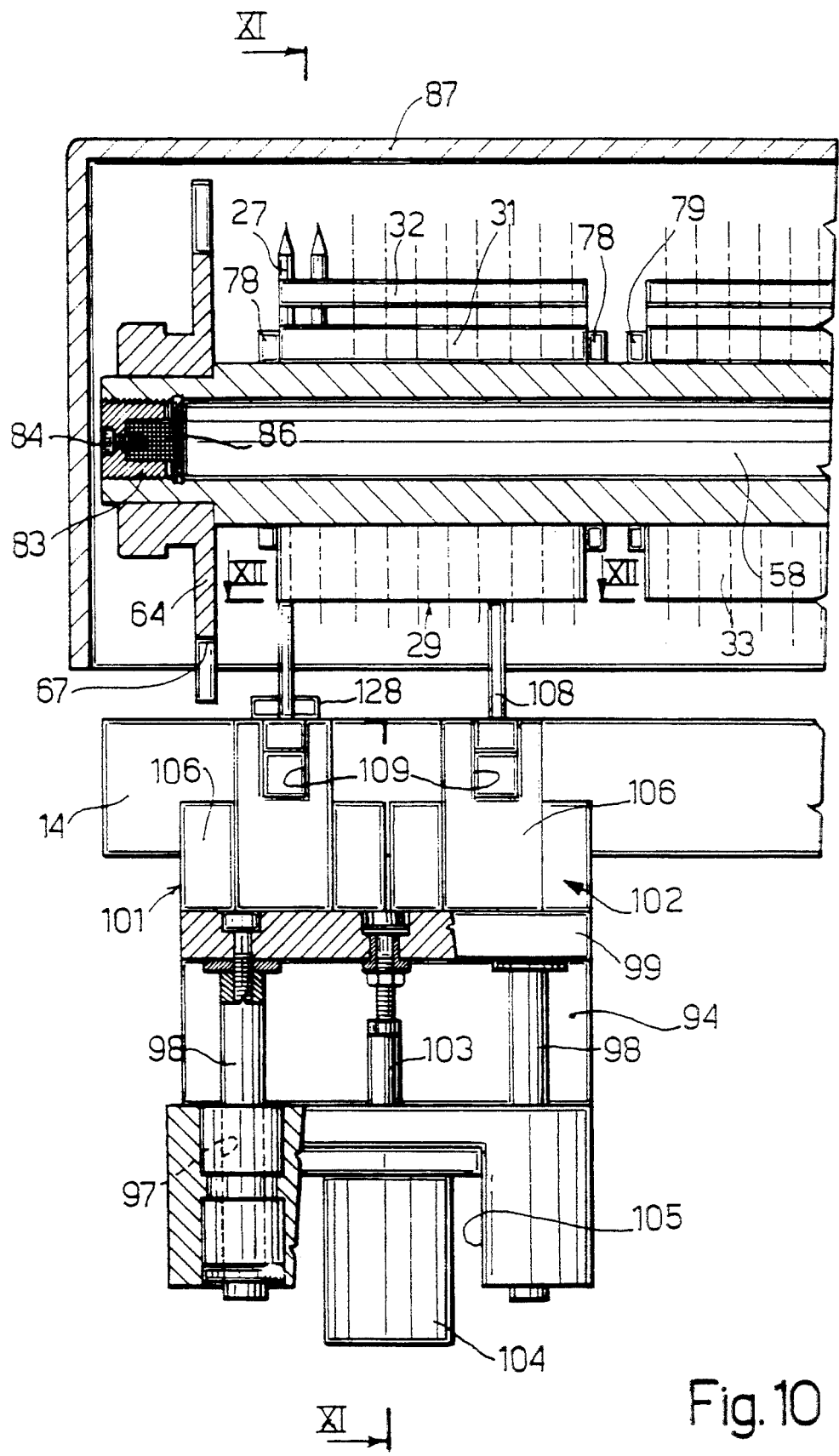
FIG. 10 shows the relative positioning of FIGS. 10A and 10B.

A sunken lateral portion 48 (FIGS. 1, 2, 11) of guide plate 12 of table 14 is fitted with a pillar 49 in turn fitted at the top with a bracket 51 extending (leftwards in FIG. 11) towards the center of the machine and having a cylindrical horizontal seat 52 (FIG. 10b) parallel to axis Y of table 14.

At seat 52, bracket 51 is fitted with a support 53 for a reversible electric motor 54 cooperating with an angular position transducer 55 and having a shaft 56 connected to a long shaft 58, rotating on a rolling bearing 59 inside seat 52, by a joint 57 enabling a small amount of misalignment of shafts 56 and 58.

Shaft 58 is designed to receive, in removable manner, a store 61 (FIGS. 6–9) for the necessary machining tools 27, and which comprises a hollow substantially prismatic drum 62, e.g. having six faces 63. At each end, drum 62 presents a flange 64, 66, each having a number of radial openings 67 corresponding with faces 63 of drum 62.

Figure 4:
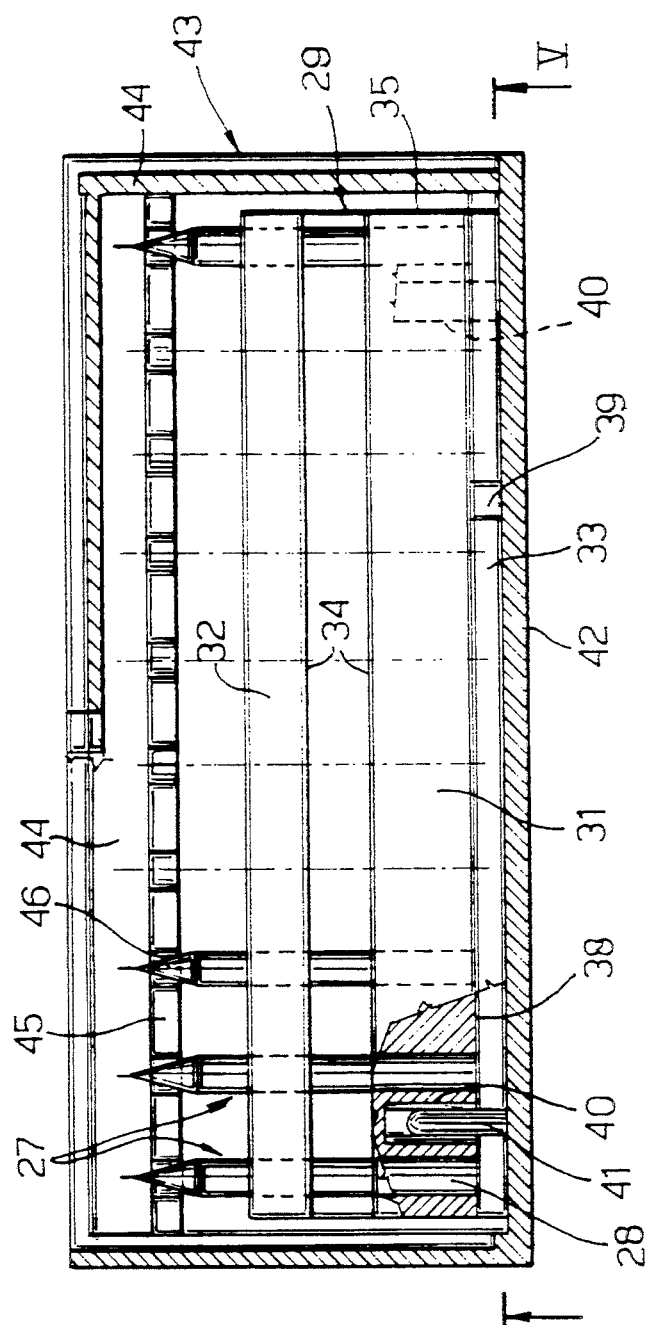
FIG. 4 shows a longitudinal section along line IV—IV in FIG. 3.
Figure 5:
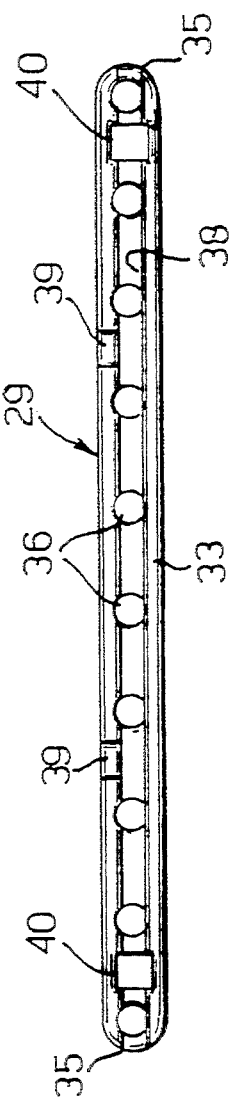
FIG. 5 shows the tool magazine along line V—V in FIG. 4.
Figure 3:
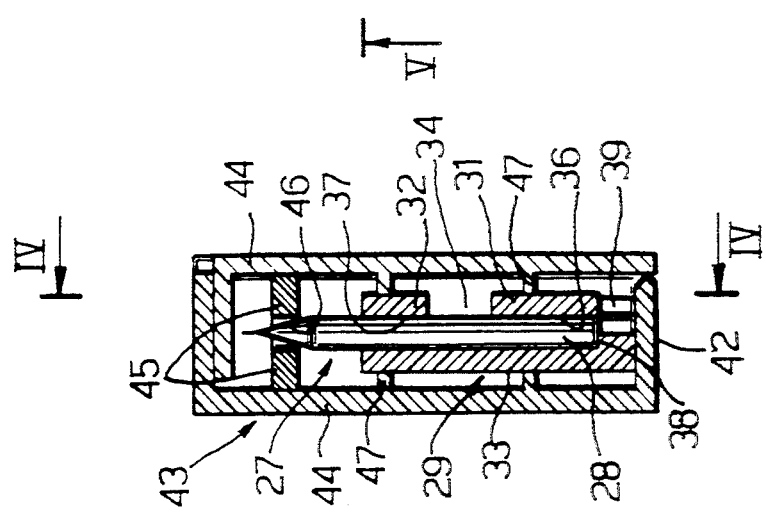
FIG. 3 shows a cross section of a tool magazine package.
Figure 6:
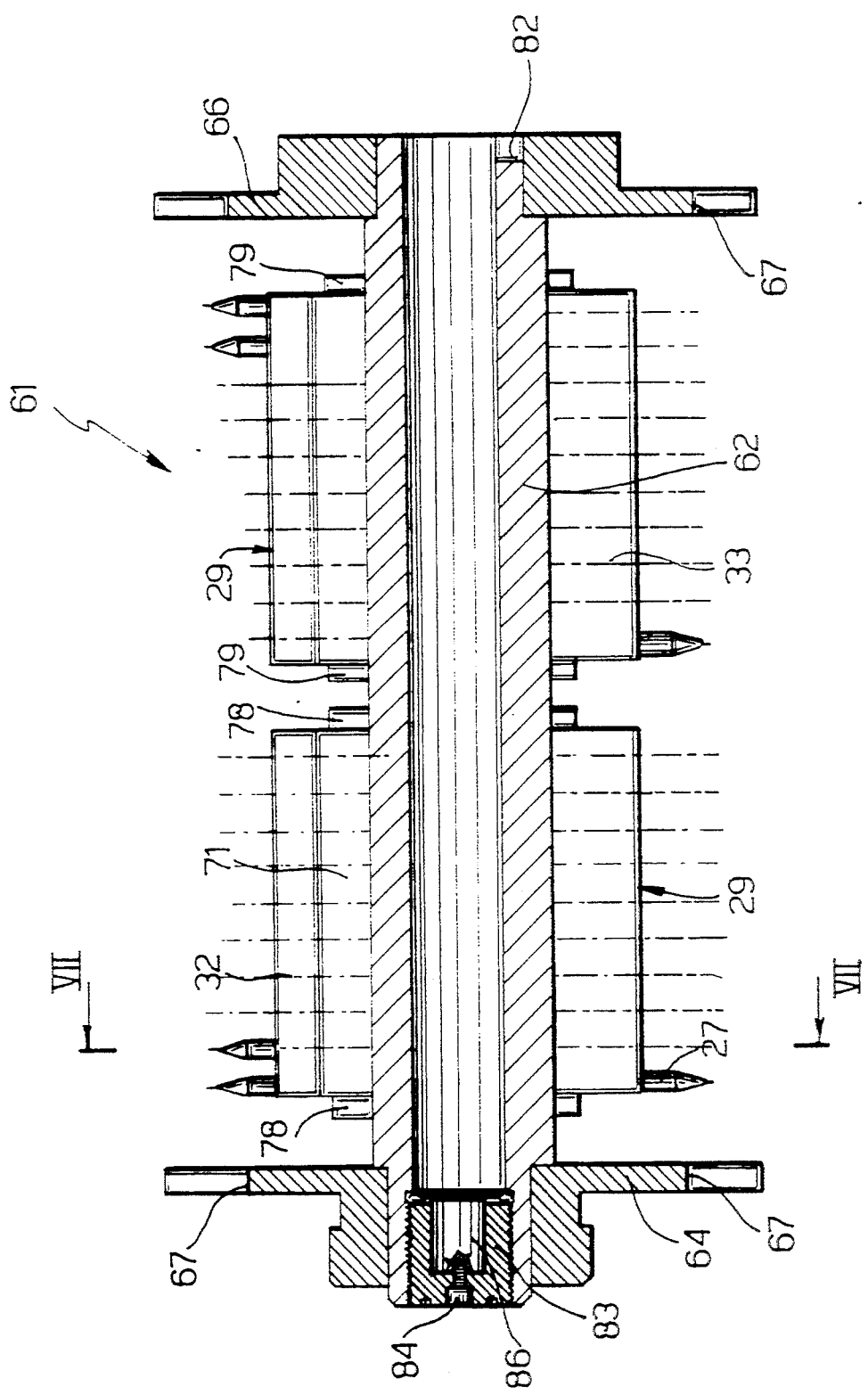
FIG. 6 shows a longitudinal half section of the tool store.

Each face 63 presents a step 68 having a toothed edge 69, with the same spacing as holes 36 and 37 of magazine 29 (FIGS. 3 and 4). Step 68 is the same height as the distance between step 38 and the bottom edge of wall 33, and step 68 of each face 63 is fitted by means of screws 70 with at least one rib 71 of plastic material, e.g. Delrin (registered trade mark). Each rib 71 presents a portion 72 with a series of ten cells 73 for housing respective tools 27. In the example shown, each face 63 is fitted with two ribs 71, so that drum 62 can accommodate up to 120 tools 27.

Portion 72 of rib 71 is located at toothed edge 69, and is separated from face 63 so as to form a longitudinal opening 74 of substantially the same height as bar 31 of magazine 29. Cells 73 (FIG. 9) present the same spacing as toothed edge 69, and are located so as to correspond with the teeth of edge 69. Each cell 73 consists of a substantially semicircular recess defined by a grip consisting of two flexible tabs 76 in turn defined by an opening 75 between adjacent cells 73 and by a hole 77 aligned with cell 73. The shape of opening 75 and the location and diameter of hole 77 determine the elasticity of tabs 76, and cells 73 are so arranged as to flexibly maintain cylindrical shank 28 of tool 27 in a radial position in relation to drum 62.

Tools 27 may be inserted manually one by one inside cells 73, in which case, each rests at the bottom on a respective tooth of edge 69; or they may be inserted together with magazine 29, for which purpose each face 63 of drum 62 presents two pairs of pins 78 and 79 for guiding magazine 29 on to a respective rib 71.

Magazine 29 is fitted on to rib 71 by pressing it gently and transversely between pins 78 or 79, so that portion 72 of rib 71 engages opening 34 between bars 31 and 32; tools 27 are engaged between tabs 76 of cells 73; bar 31 engages opening 74; and wall 33 contacts edge 69. Drum 62 may thus accommodate up to twelve magazines 29.

For fitting store 61 on to shaft 58 (FIGS. 10a and 10b), shaft 58 presents a radial pin 81 designed to engage a recess 82 formed on the rear end of drum 62, the front end of which presents an internal thread in which is screwed an externally threaded ring nut 83 connected to a permanent magnet 86 by means of a screw 84.

Store 61, loaded with the necessary tools 27, is fitted manually on to shaft 58 and oriented so as to engage radial pin 81 inside recess 82; and drum 62 brings magnet 86 into contact with the front end of shaft 58, so that drum 62 is fixed axially.

When fitted on to shaft 58, store 61 is protected by a curved housing 87 (FIGS. 2 and 11) having two tabs 88 with holes by which it pivots on a shaft 89 supported on bracket 51. Housing 87 normally rests on a stop 92 on bracket 51, and is rotated clockwise about shaft 89 for enabling access to store 61.

TOOL CHANGE DEVICE

The automatic tool change device 93 (FIGS. 10a and 11) is fitted to a support 94 in turn fitted to a plate 96 welded to the front right-hand corner of table 14. Support 94 presents two cylindrical vertical guides 97 in which slide two columns 98 fitted to a horizontal plate 99 in turn fitted with a pickup clamp 101 and an unloading clamp 102. Plate 99 is connected to rod 103 of a pneumatic actuator 104 housed inside recess 105 of support 94 and which provides for moving rod 103 vertically downwards by a given amount in relation to the FIGS. 10a and 11 position.

Figure 12:
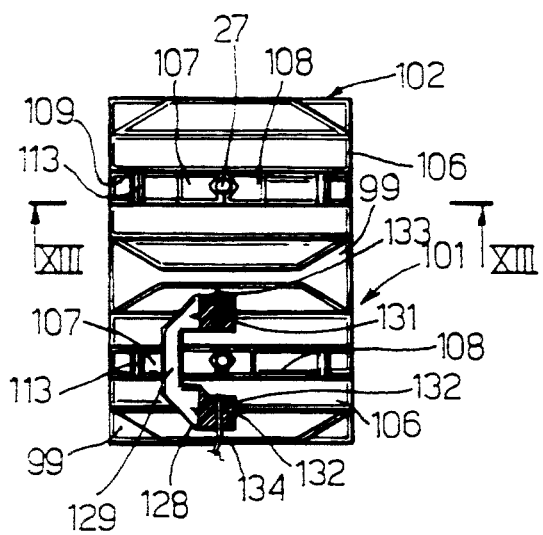

Each of clamps 101 and 102 (FIGS. 12–14), which are identical and separated axially by a given travel distance, consists of a supporting block 106 fitted in removable manner to plate 99, and comprises a pair of substantially symmetrical jaws 107, 108 housed in a recess 109 in block 106 perpendicular to the axis of drum 62.

Each jaw 107, 108 pivots on a pin 111 (FIG. 13) and comprises a horizontal arm 112 arrested at the top against an eccentric pin 113. Each arm 112 normally engages a hollow piston 114 housed in a cylindrical seat 116 on block 106 and pushed upwards by a compression spring 117.

Jaws 107 and 108 also present respective appendixes 118 and 119 cooperating with the upper surface of a column 120. Appendix 119 of jaw 108 presents a central opening 121 for appendix 118 of jaw 107; and column 120 slides inside a seat 122 in block 106, located between the two cylindrical seats 116, and is fitted to the piston 123 of a pneumatic cylinder 124. Each jaw 107, 108 also comprises a vertical arm 125 having a clamping end 126 with a V-shaped seat for engaging shank 28 of tool 27.

Figure 13:
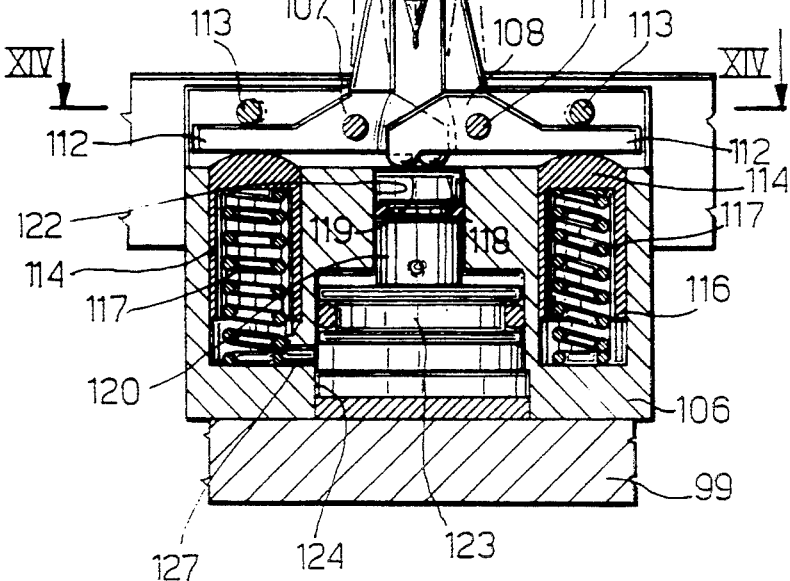
FIG. 13 shows an enlarged section along line XIII-—XIII in FIG. 12.
Figure 14:
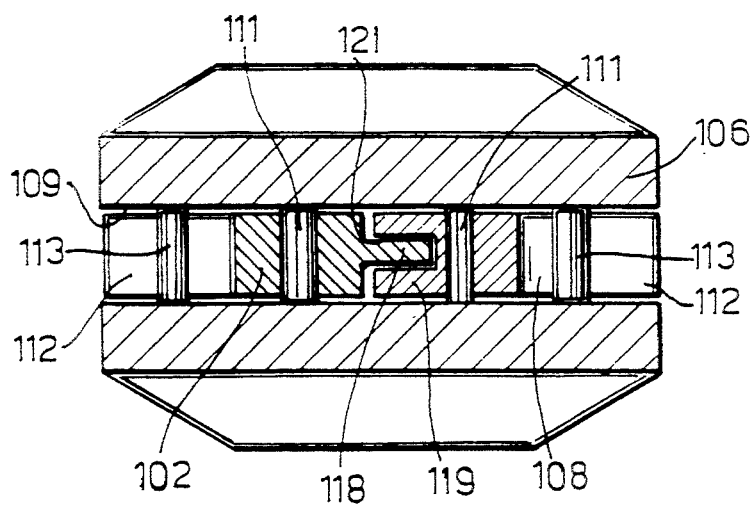
FIG. 14 shows a section along line XIV—XIV in FIG. 13.

Pneumatic cylinder 124 presents a compressed air conduit 127 and, when supplied, maintains piston 123 in the top position wherein column 120 opens jaws 107, 108 as shown by the dotted line in FIG. 13. Conversely, when the air supply to cylinder 124 is cut off, springs 117 via pistons 114 act on arms 112 so as to rotate jaws 107, 108 simultaneously and symmetrically, and so close vertical arms 125 as shown by the continuous line in FIG. 13.

TOOL CHANGE CYCLE

Device 93 for automatically changing tool 27 in spindle 26 operates as follows.

Actuator 104 (FIG. 11) normally maintains plate 99, together with clamps 101 and 102, in the lowered position shown partially by the dotted line; and jaws 107 and 108 of clamps 101 and 102 are held open by cylinders 124 (FIG. 13).

Figure 2:
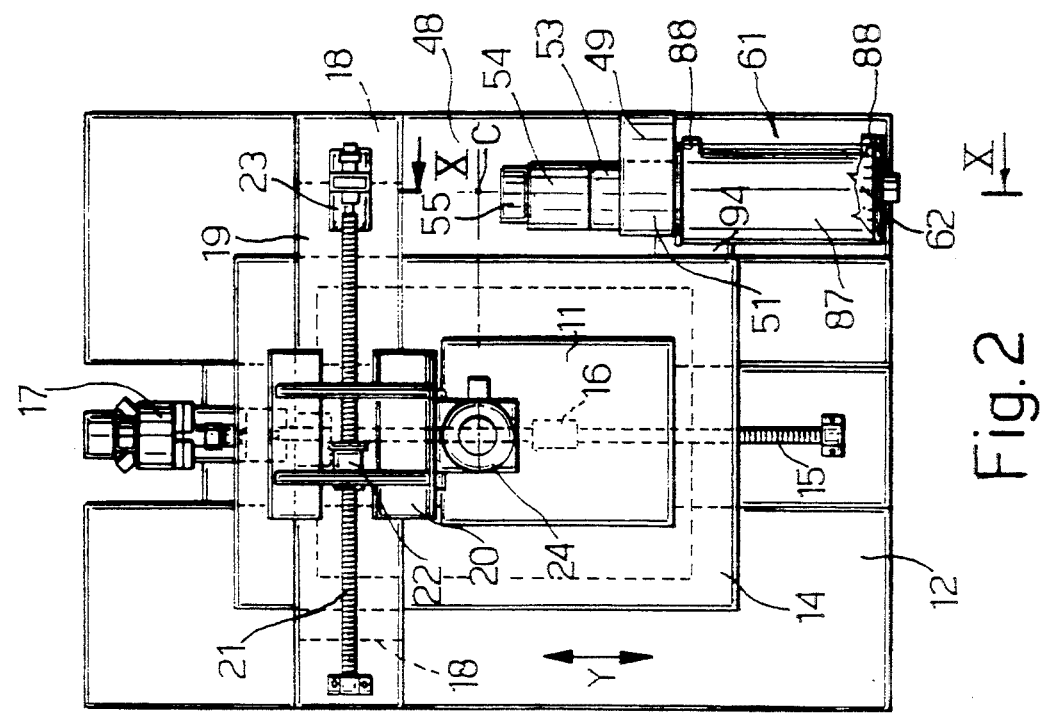
FIG. 2 shows a schematic plan view of the FIG. 1 drilling machine.

With reference also to FIGS. 1 and 2, to change tool 27 in spindle 26 upon completion of a pack of printed circuit boards 11, machining head 20 moves rightwards along axis X so as to move spindle 26 into the tool change position C on the axis of store 61; and table 14 backs up along axis Y so as to also move unloading clamp 102 into position C. By virtue of jaws 107, 108 of clamps 101, 102 being open, the tips of tools 27 on drum 62 pass between appendixes 126 of jaws 107, 108.

At this point, spindle 26 is lowered so as to feed the used tool 27 between jaws 107, 108 of unloading clamp 102; clamp 102 is closed and the clamp on spindle 26 opened so that tool 27 is now gripped by unloading clamp 102; and actuator 104 is operated for lowering plate 99 together with clamps 101 and 102 and so withdrawing tool 27 from spindle 26.

Figure 11:
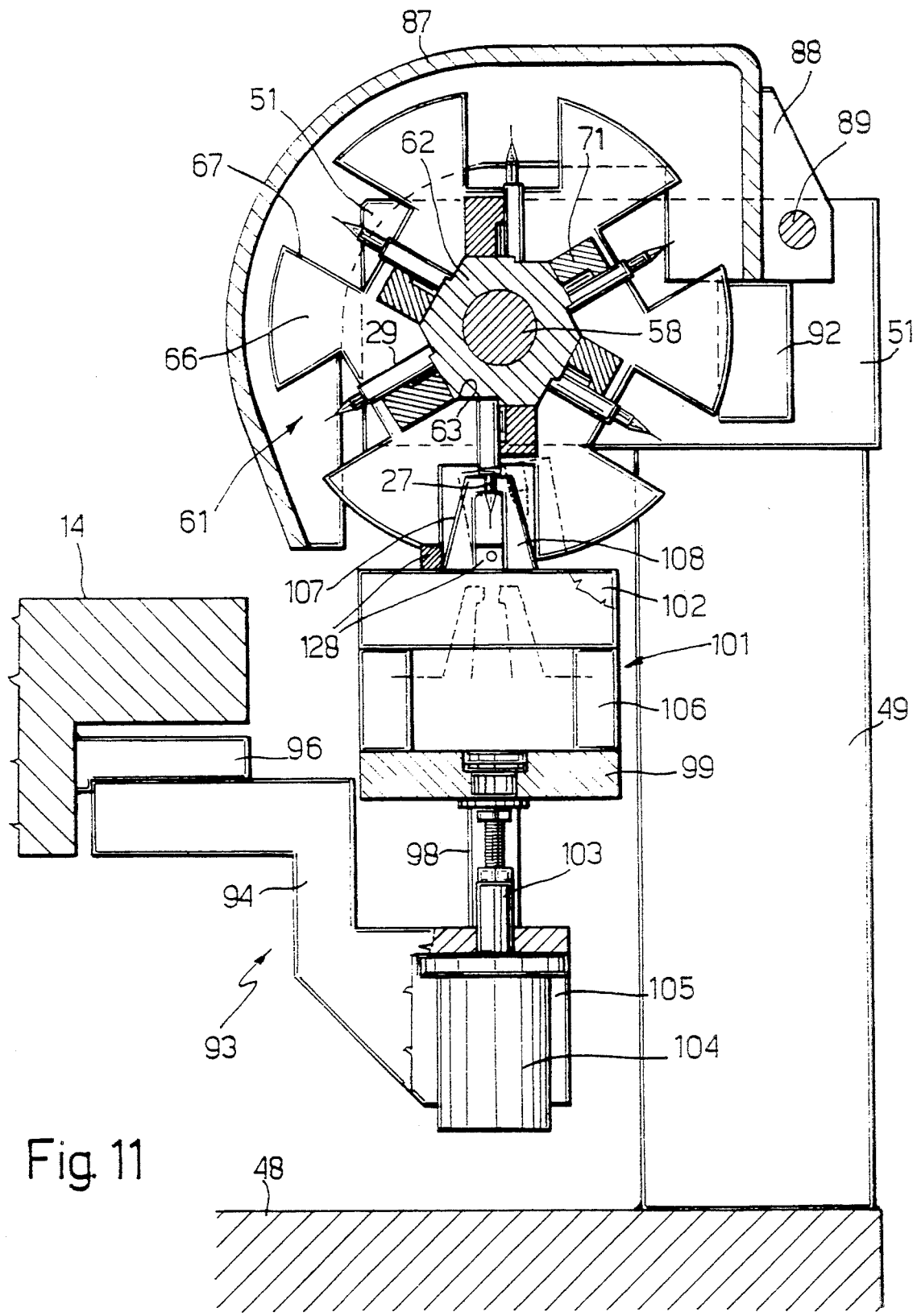

Motor 54 and shaft 58 now rotate drum 62 anticlockwise by a given angle into the position shown partially by the dotted line in FIG. 11, so that tools 27 on the two in-line ribs 71 are moved clear of the longitudinal path of tool 27 in clamp 102; and table 14 moves forward so as to position unloading clamp 102 and the used tool 27 in the plane transverse to the cell 73 on rib 71 from which tool 27 was originally withdrawn.

At this point, drum 62 is rotated back to the angular position shown in FIG. 11, wherein holes 36 and 37 of magazine 29 are aligned with tool 27 in clamp 102; actuator 104 is operated so as to raise plate 99; clamp 102 inserts tool 27 inside cell 73; and clamp 102 is opened and plate 99 lowered.

In the event the new tool 27 is located on a rib 71 in a different angular position on drum 62, this is indexed or rotated selectively by motor 54 and shaft 58 (FIG. 10b); at the same time, table 14 moves pickup clamp 101 up to the new tool 27 (FIG. 11); plate 99 is raised; clamp 101 is closed about tool 27; and plate 99 is lowered so as to withdraw tool 27 from cell 73 on drum 62.

After rotating drum 62 as described previously, for enabling the passage of tool 27 in clamp 101, table 14 backs up so as to move clamp 101 into position C and in line with spindle 26; plate 99 is raised so as to insert and clamp tool 27 in spindle 26; and clamp 101 is opened.

Alternatively, tool change device 93 may be so controlled that the new tool 27 is picked up first by clamp 101; the used tool 27 is then unloaded by clamp 102; the new tool 27 is inserted inside spindle 26; drum 62 is restored to the angular position shown in FIG. 11; and the used tool 27 is replaced in store 61.

AXIAL POSITIONING OF THE TOOL IN THE SPINDLE

Tool change device 93 (FIG. 11) presents a sensor 128 for detecting the tip of tool 27 inserted inside spindle 26, and comprising a C-shaped body 129 (FIG. 12) fitted to body 106 of pickup clamp 101. The two opposite wings of body 129 present respective seats 131 and 132 having a common axis perpendicular to the rotation plane of jaws 107, 108 and intersecting the axis of tool 27 between jaws 107, 108. Seats 131 and 132 respectively house a photoemitter 133 and a photosensor 134 connected by optical fibers to the electronic control unit. Photosensor 134 performs the function of a photocell, and provides for supplying a tool tip intercept signal to the control unit.

On inserting the new tool 27 in spindle 26 and opening clamp 101, as described above, tool 27 is clamped inside spindle 26 (FIGS. 1 and 11) in a relatively approximate axial position. The control unit therefore controls downward displacement of spindle 26 for enabling sensor 128 to determine the location of the tip of tool 27.

Upon the tip of tool 27 crossing the axis of photocell 134, this transmits a signal to the control unit, which first closes pickup clamp 101 and opens the clamp on spindle 26, so that tool 27 is temporarily gripped by clamp 101; and then lowers spindle 26 by a given distance in relation to its former position when the location of the tip of tool 27 was determined by sensor 128.

At this point, the control unit opens clamp 101 and closes the clamp on spindle 26, so as to position the tip of tool 27 in a given axial position in relation to spindle 26, and so eliminate any error in the axial position of tool 27 or due to wear of the tip. Spindle 26 is then raised and the next drilling cycle commenced at the locations defined along the Y axis of table 14 and the X axis of machining head 20.

Figure 15:
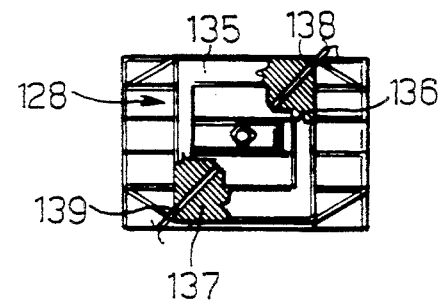
FIG. 15 shows a variation of a detail in FIG. 12.

According to the FIG. 15 variation, sensor 128 presents a body 135 in the form of a rectangular frame surrounding top arms 125 of jaws 107, 108 of clamp 101. Two opposite corners of the frame present two seats 136, 137 having a common axis intersecting the axis of tool 27 between jaws 107, 108, but which slopes in relation to the rotation plane of the jaws. Seats 136, 137 respectively house a photoemitter 138 and a photosensor 139 operating in exactly the same way as photosensor 134 in FIG. 12.

The advantages of the tool change device according to the present invention will be clear from the foregoing description. Firstly, it provides for loading drum 62 with single tools 27, as well as magazines 29 of tools 27 as supplied by the maker or as inserted by the operator. Secondly, drum 62 may be set up off the machine and unloaded anywhere with no danger of damaging tools 27.

Finally, sensor 128 for detecting the tip of tool 27 in spindle 26 provides not only for eliminating the collar or similar for axially positioning shank 28 of tool 27, but also for compensating tool wear with no need for determining the length of tool 27 or adjustments along the Z axis. Such compensation in fact normally requires increasingly greater travel of the spindle, thus increasing the drilling cycle and so reducing output of the machine.

To those skilled in the art it will be clear that changes may be made to tool store 61 and tool change device 93 as described and illustrated herein without, however, departing from the scope of the present invention. For example, clamps 101, 102 may be replaced by a different type of clamping mechanism; store 61 may present various designs: cylindrical sector, movable two-axis plate, etc.; the locations of pickup clamp 101 and unloading clamp 102 may be inverted; or one clamp may be employed alternately for picking up and unloading tool 27.

We claim:

1. An automatic tool change device for a machine tool for printed circuit boards, said machine including a stationary frame (12), a board carrying table (14) movable on said frame along an axis of travel (Y), and a tool spindle (26) movable perpendicularly to said table; said device comprising a drum (62) having its axis parallel to said axis of travel (Y), said drum presenting a number of radial locations (71), each one having a number of rows of cells (73) for housing corresponding tools (27), tool clamping means (101, 102) operable for clamping one of said tools, mounting means (58, 81, 82, 86) for removably mounting said drum (62) on said frame, indexing means (54) for angularly indexing said drum (62) for selecting one of said rows to be presented to said clamping means (101, 102), and mounting means (94, 96) for mounting said clamping means on said table, whereby said clamping means select a predetermined one of said cells in the so selected row for picking up a new tool and relocating a used tool by moving said table along said axis.

2. A device as claimed in claim 1, wherein said clamping means (101, 102) comprise a pickup clamping device (101) for picking up said tool (27) from said drum (62) and an unloading clamping device (102) for unloading said tool (27) from said spindle (26); said clamping devices (101, 102) being aligned in a direction parallel to said axis of travel (Y).

3. A device as claimed in claim 2 wherein at least one of said clamping devices comprises a clamp (101, 102) operatable for gripping a tool (27) extracted from a cell (73) of said drum (62) or from said spindle (26), said clamp comprising a pair of jaws (107, 108) rotatable symmetrically in a plane perpendicular to the rotating axis of said drum (62).

4. A device according to claim 3, wherein said pair of jaws comprise a pair of elements (118, 119) operable simultaneously by a pneumatic piston (120) for opening said clamp (101, 102), and a pair of arms (112) engageable by a corresponding pair of spring urged members (114) for closing said clamp (101, 102).

5. A device as claimed in claim 2, comprising a sensor (128) for detecting said tool (27) inside said spindle (26); and drive means (25) for axially moving said spindle (26) and so enabling said sensor (128) to detect the tip of said tool (27); and wherein said sensor (128) cooperates with said clamping means (101, 102); said drive means (25) being controlled and said clamping means (101, 102) and said spindle (26) providing alternately for clamping said tool (27) in response to a signal from said sensor (128), for accurately adjusting the axial position of said tool (27) in said spindle (26).

6. A device as claimed in claim 5, wherein said spindle (26) is movable along a second axis (X) into a tool change position (C); and wherein said sensor (128) provides for temporarily gripping said tool (27) in said pickup clamping device (101) and for so controlling said drive means (25) as to move said spindle (26) further and into a position a given distance in relation to said tool (27).

7. A device as claimed in claim 6, characterized by the fact that said sensor (128) comprises a photosensor (134, 139) and is fitted to said pickup clamping device (101); said photosensor (134, 139) operating on an axis perpendicular to the axis of said spindle (26), for detecting passage of the tip of said tool (27) inserted inside said spindle (26).

8. A device as claimed in claim 7, wherein said pickup device (101) comprises a pair of jaws (107, 108) rotatable symmetrically in a predetermined plane, and wherein said sensor (128) comprises a C-shaped body (129) surrounding said pickup clamping device (101); said body (129) presenting two arms having two seats (131, 132) respectively housing a photoemitter (133) and a photosensor (134) aligned along an axis perpendicular to said rotation plane of said pair of jaws (107, 108).

9. A device as claimed in claim 7, wherein said sensor (128) comprises a body (135) in the form of a quadrangular frame surrounding said pickup clamping device (101); two opposite corners of said body (135) presenting two seats (136, 137) respectively housing a photoemitter (138) and a photosensor (139) aligned along an axis sloping in relation to said rotation plane of said pair of jaws (107, 108).

10. A device as claimed in claim 1, characterized by the fact that said two clamping devices (101, 102) consist of two identical clamps (101, 102) on a common support (99); comprising an actuator (104) for moving said common support (99) by a given distance and radially in relation to said drum (62).

11. A device as claimed in claim 10, wherein said drum (62) is provided at each end with a flange (64, 66) for protecting said tools (27); at least one of said flanges (64, 66) presenting radial openings (67) corresponding with said locations (71) for enabling the passage of a tool (27) engaged by one of said clamps (101, 102), and wherein said distance is less than the length of said tool (27); said indexing means (54) providing for temporarily rotating said drum (62) by a given angle for positioning the tools (27) in the relative locations (71) clear of the longitudinal path of the tool (27) gripped by one of said clamps (101, 102).

12. A device according to claim 1, wherein said tools (27) are arranged in groups in at least a magazine (29), each one of said cells (73) including elastic means (76) for individually retaining said tools (27), said drum (62) including guiding means (78, 79) for guiding said magazine (29) as to bring the tools (27) arranged therein simultaneously in engagement with said elastic means (76).

13. A device as claimed in claim 12, wherein said drum (62) is designed to house, in each said radial location (71), a plurality of said magazines (29), each one of said magazines being selectable by moving said table (14) along said axis (Y).

14. A device as claimed in claim 1, wherein at each end, said drum (62) presents a flange (64, 66) for protecting said tools (27); at least one of said flanges (64, 66) presenting radial openings (67) for enabling the passage of a tool engaged by said clamping devices (101, 102).

15. A device as claimed in claim 14, characterized by the fact that said drum (62) is hollow and mounted in removable manner on a rotary shaft (58); retaining means (81, 82; 86) being provided for angularly and axially securing said drum (62) to said shaft (58).

16. A device as claimed in claim 15, characterized by the fact that said drum (62) is made of plastic material and said shaft (58) of ferromagnetic material; said retaining means (81, 82; 86) comprising a permanent magnet (86) fitted to one end of said drum (62) and engaging a corresponding end of said shaft (58).

17. A device as claimed in claim 16, characterized by the fact that said drum (62) is in the form of a polygonal prism, and comprises, on each lateral face (63), two ribs (71), each having a number of cells (73) for retaining said tools (27); each cell (73) comprising elastic means (76) for retaining said tool (27) in such a manner as to enable it to be withdrawn from and inserted inside said cell (73) by exerting a predetermined force radially in relation to said drum (62).

18. A device as claimed in claim 17, characterized by the fact that said cells (73) are formed in a portion (72) of said rib (71) of relatively yieldable plastic material; said elastic means including a pair of tabs (76) formed in one piece from said portion (72); and the tabs (76) of adjacent said cells (73) being separated by at least one opening (75) so shaped as to provide for a given elasticity of said tabs (76).

19. A device as claimed in claim 1, wherein said drum (62) is supported on a supporting member (49, 51) fitted inside a depression (48) in the fixed guide plate (12) of said table (14).

20. A device as claimed in claim 19, characterized by the fact that said drum (62) is protected by a curved housing (87) pivoting on a shaft (89) fitted to said supporting member (49, 51); said housing (87) being rotatable for enabling assembly of said drum (62).

* * * * *